United States Patent [19]
Cronin et al.

[11] Patent Number: 5,991,837
[45] Date of Patent: Nov. 23, 1999

[54] REVERSE ORIENTED PROCESSOR CONFIGURATION

[75] Inventors: Jeffrey J. Cronin, Blain, Minn.; Travis J. Schaff, Meridian, Id.

[73] Assignee: Micron Electronics, Inc., Nampa, Id.

[21] Appl. No.: 08/982,573

[22] Filed: Dec. 2, 1997

[51] Int. Cl.[6] .......................... G06F 13/00; G06F 15/163; H05K 7/14; H05K 7/02
[52] U.S. Cl. .......................... 710/100; 710/101; 361/688; 361/737
[58] Field of Search ..................................... 710/100, 129, 710/131, 101; 361/695, 683, 736, 688, 689, 690, 694, 709, 725, 737; 712/1, 10

[56] References Cited

U.S. PATENT DOCUMENTS

| | | | |
|---|---|---|---|
| 4,800,383 | 1/1989 | Considine | 340/825.79 |
| 5,058,053 | 10/1991 | Gillett | 710/131 |
| 5,751,550 | 5/1998 | Korinsky | 361/695 |
| 5,892,965 | 4/1999 | Miura et al. | 712/34 |

*Primary Examiner*—Gopal C. Ray
*Attorney, Agent, or Firm*—Dorsey & Whitney LLP

[57] ABSTRACT

Reversing the orientation of the processors in a dual-processor arrangement enables the overall length of the host bus to be reduced. In addition, less board layers may be required because the number of data and address/control bus crossovers is also reduced. Furthermore, the heat-dissipation surfaces of the processors may be aligned to face one another thereby forming a channel. This makes it more efficient to cool the processors because heat may be drawn away from each processor with a common fluid stream that can be propelled through the channel with a single fluid propeller.

43 Claims, 9 Drawing Sheets

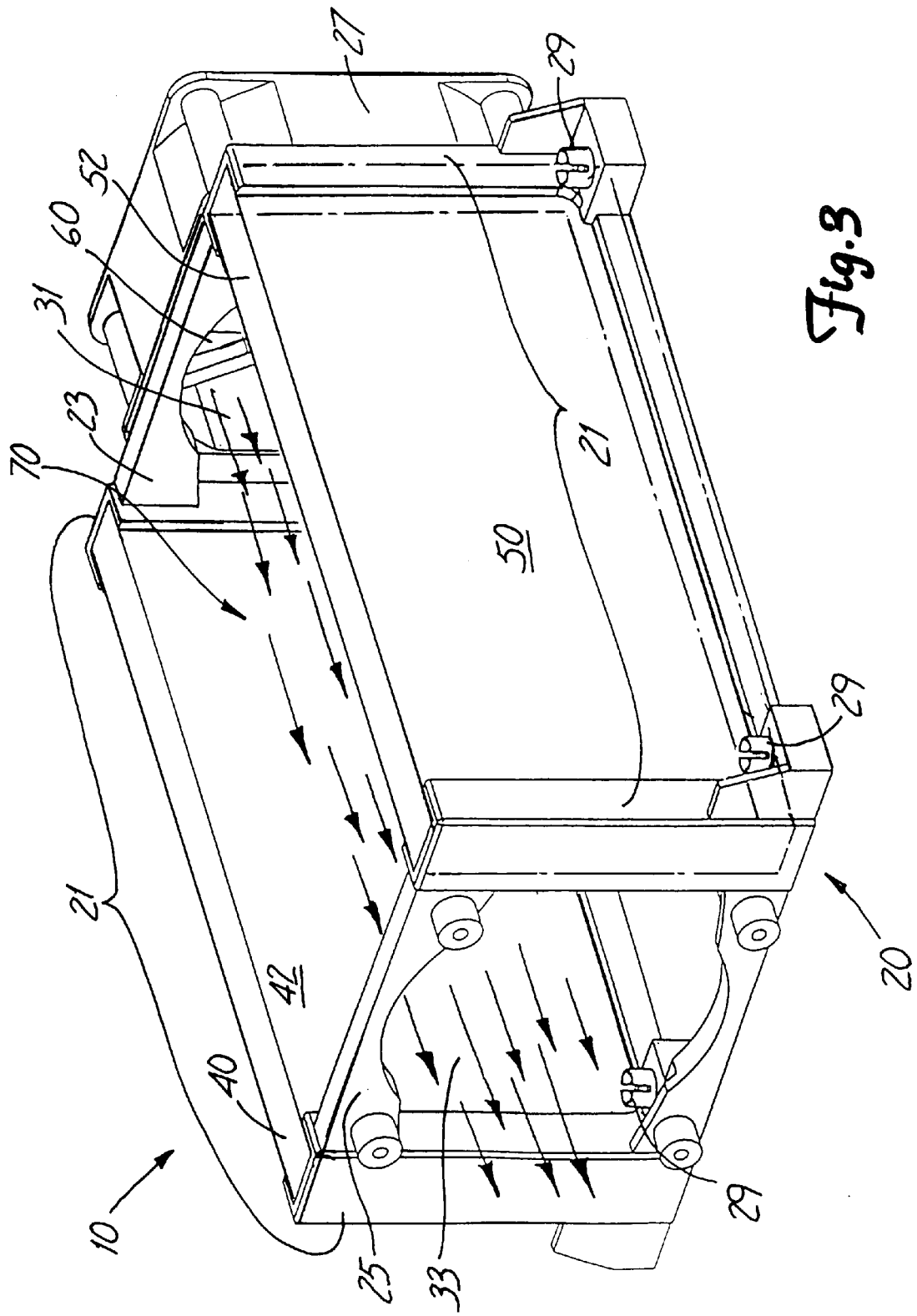

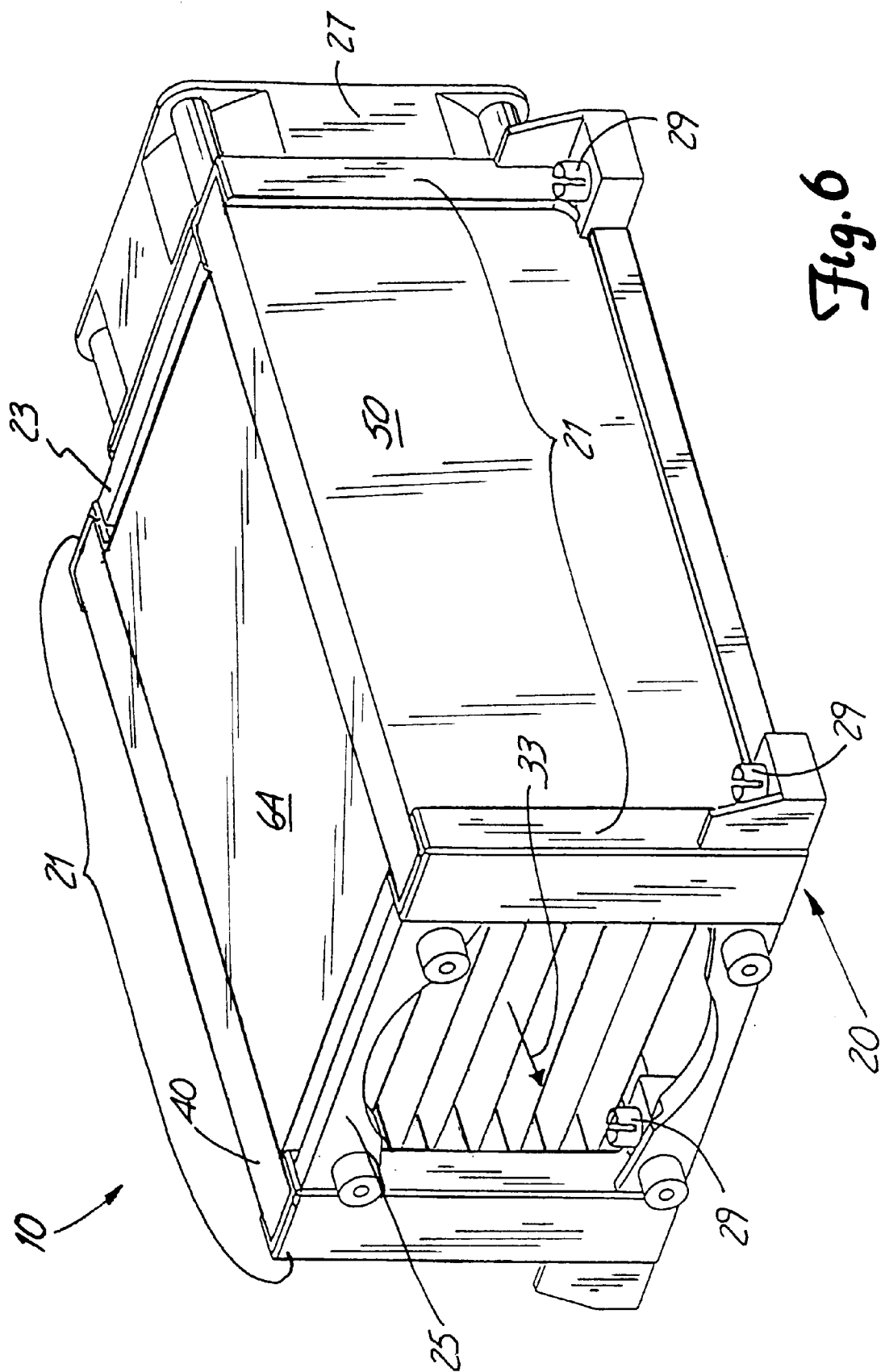

REVERSE ORIENTED PROCESSOR CONFIGURATION

1. TECHNICAL FIELD

The present invention relates generally to system board design for a multiple processor configuration. In particular, the present invention relates to the orientation of dual processors in a multiple processor computer system.

2. BACKGROUND OF THE INVENTION

Some computer systems incorporate multiple processors that run simultaneously on a common host bus. A host "chipset", which usually includes several host chips, is used for system control to connect (or "bridge") the processors to memory and various busses (e.g., PCI1, PCI2, IDE).

FIGS. 1A through 1C show dual-processor configurations with conventional host bus routing schemes. A host bus, which includes an address/control bus 8 and a data bus 9, interconnects processors 3 and chips 7 (from a host chipset) to one another. (Dashed lines 8 and darkened lines 9 generally represent bus routing paths for the address/control and data busses, respectively.) Each processor 3 has a contact grid which includes two rows of electrical contacts: A1–A121 and B1–B121. The electrical contacts are divided into an address/control section 4 and a data section 5. In turn, as is depicted in FIG. 1A and 1B with host chips 7 from an Intel 440FX™ chipset and an Intel Orion™ chipset, respectively, dedicated host chips, which connect either to the address/control bus 8 or to the data bus 9, are used with conventional dual-processor arrangements. The processors 3 are typically configured into a spaced-apart pair, with their contact grids oriented in the same direction. Between processors 3, host chips 7 are located proximate to their connected contact grid sections so as to minimize the data bus 9 and address/control bus 8.

As noted above, orienting the contact grids of a pair of processors in the same direction is conventional design. It appears that this design was chosen for two primary reasons.

First, it is logically somewhat simpler for a human designer to have two complex sets of contacts placed in a common orientation. The designer can count on the same pins being in the same location with no mental transformation required in planning the connections to both chips. That is, the array of data pins on each processor is aligned with the corresponding array on the other processor and individual pins are also aligned. Likewise, the arrays and the individual pins of the address/control sections are also aligned.

Second, as seen in FIGS. 1A and 1B, to the extent bus connections can run from the data section of one processor to the data section (or address/control section) of the other processor with only one or two connections to dedicated chips in between, the high level layout is easier to visualize.

However, improvements in chipset design have led to chipsets that incorporate multiple non-dedicated chips, which require connections to both the host data and host address/control busses. Unfortunately, as seen in FIG. 1C (with chips 5 from a Micron Samurai™ chipset) such chipsets cause bus routings to increase in length and become more congested, which results in multiple bus crossovers. Extra board layers may be needed to accommodate these crossovers. Moreover, longer bus traces not only consume excessive board space, but also increase noise problems that are associated with line reflections.

In addition, when dual processors are mounted in vertical packages (e.g., single edge cartridges) with their contact grids oriented in the same direction, their heat dissipation surfaces (along with associated heatsinks) will normally face the same direction. Cooling both heatsinks requires either a sufficiently wide fluid stream or two separate fluid streams to adequately encounter each processor's heatsink. Thus, excessive board space is consumed to accommodate a wide fluid propeller (or propellers) for generating such a fluid stream(s).

It will be evident that the conventional configuration of paired processors facing the same direction is just one possible choice. The processors could be placed in a variety of spacial configurations relative to each other, by selecting from all the different rotational, distance and angular options available. However, each selection has implications for thermal, mechanical, and electrical design.

Accordingly, what is needed in the art is a dual processor arrangement with improved host bus routings and an improved scheme for cooling the processors.

3. SUMMARY

Reversing the conventional orientation of the processors in a dual processor design has been found advantageous. It enables the overall length of the host bus to be reduced. In addition, fewer board layers may be required because the number of data and address/control bus crossovers is also reduced. Furthermore, the heat-dissipation surfaces of the processors may be aligned to face one another, thereby forming a shared channel between them. This makes it more efficient to cool the processors because heat may be drawn away from each processor with a common fluid stream that can be propelled through the channel with a single fluid propeller.

In one embodiment, a multi-processor design with reverse-oriented processors is provided. The system includes a system board with a host bus. The system board is designed to accommodate a host chip, a first processor, and a second processor. The host bus further includes a data bus and an address/control bus. The first and second processors each have a data and an address/control contact section. The processors mount to the system board spaced apart from one another in reverse orientation, with the data contact sections connected to the data bus and the address/control contact sections connected to the address/control bus. The host chip may be mounted to the system board substantially between the first and second processors and is operably connected to both the data bus and the address/control bus. With this arrangement, the data and address/control busses need only cross over one another on one occasion.

In another embodiment, a reverse-oriented dual-processor assembly for mounting onto a system board is provided. The assembly includes first and second vertically-mountable processor modules, each of which has a heat-dissipation surface. The vertically-mountable processor modules are connected to the system board and aligned such that their heat-dissipation surfaces substantially face one another to form a shared channel. A fluid propeller is provided to propel a fluid through the shared channel in order to convey heat out of the channel and thereby away from the heat-dissipation surfaces to cool the first and second vertically-mountable processor modules.

Other embodiments of the present invention will become more fully apparent and understood with reference to the following specification and to the appended drawings and claims.

4. BRIEF DESCRIPTION OF THE DRAWINGS

FIG. 3 is a perspective view of one embodiment of a reverse-oriented dual-processor assembly.

FIG. 6 is a perspective view of a third embodiment of a reverse-oriented dual-processor assembly depicting a unitary heatsink for both processor modules.

5. DETAILED DESCRIPTION

With the present invention, an improved dual-processor arrangement is provided for a multi-processor computer system. When using a host chipset with a chip(s) that connects to both the address/control and data busses, reversing the orientation of the processors relative to conventional, same-direction orientation enables host bus routings and crossovers to be reduced. In addition, with a reverse-oriented, dual-processor assembly, the processors can be positioned relative to one another (regardless of the particular type of chipset) to more efficiently cool each processor with a common fluid stream.

5.1 Host Bus Routing
5.1.1 A First Embodiment

Figure 2A:
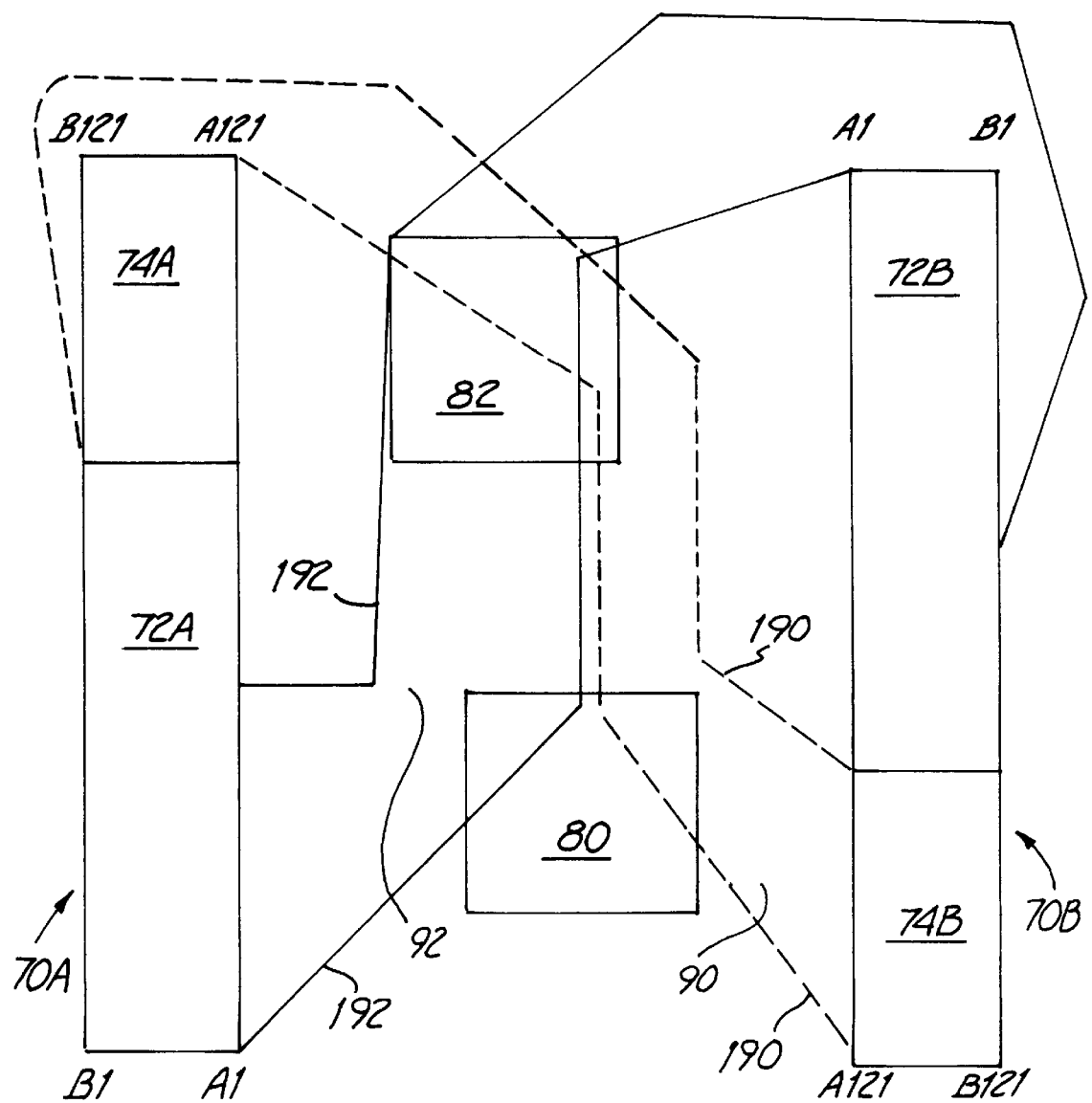
FIG. 2A is a bus routing diagram depicting one embodiment of a bus routing for processors arranged in reverse orientation in accordance with the present invention.

FIG. 2A shows one embodiment of a routing scheme for the host bus of a multi-processor system having first and second processors 70A, 70B, respectively. The host bus comprises an address/control bus 90 and a data bus 92. Dashed lines 190 identify a routing pattern for the traces that constitute address/control bus 90. In turn, lines 192 identify a routing pattern for the traces that constitute data bus 92.

Address/control bus 90 and data bus 92 operably connect first processor 70A, second processor 70B, a first host chip 80, and a second host chip 82 to one another. (The first and second processors 70A, 70B, respectively, are actually removably connected to the host bus 90/92 through connectors, which are not shown.) Each processor 70A, 70B has a contact grid comprising electrical contacts physically divided into a data section 72A, 72B, respectively, and an address/control section 74A, 74B, respectively. (In the depicted embodiment of FIG. 2A, each processor has a 2×121 contact grid, which includes contacts A1–A121 and B1–B121.) The first processor 70A includes data section 72A and address/control section 74A, which are connected to the data bus 92 and address/control bus 90, respectively. Likewise, the second processor 70B includes data section 72B and address/control section 74B, which are also connected to the data bus 92 and address/control bus 90, respectively.

The first and second processors 70A, 70B are in reverse orientation with respect to one another. Processors are in "reverse-orientation" when spaced apart from one another with their contact grids aligned in opposite directions. (It should be noted that vertically-mountable processors are also in reverse orientation, regardless of their contact grid alignment, when their heat-dissipation surfaces substantially face one another. This is addressed in greater detail below.) In contrast, processors are in conventional orientation when their contact grids are aligned in the same direction and their heat-dissipation surfaces do not face one another (if they are each packaged as part of a vertically-mountable processor module).

The first and second processors 70A, 70B may be any processors that are capable of operating in a dual-processor architecture. In the depicted embodiment of FIG. 2A, the first and second processors 70A, 70B illustratively are Pentium II™ processors packaged in a single edge cartridge ("SEC"), available from Intel Corporation of Santa Clara, Calif. Other possible processors could include but are not limited to Cyrix 6X86™ processor available from Cyrix Corporation of Richardson, Tex., AMD K6™ processors available from AMD of Sunnyvale, Calif., as well as other Pentium™ family processors available from Intel Corporation.

First and second host chips 80, 82 are shown located substantially between the first and second processors 70A, 70B. The first and second host chips 80, 82 are used in "bridging" the processors 70A, 70B with memory, a PCI1 bus, and possibly other busses such as a PCI2 bus, an AGP bus, an IDE bus, or additional PCI/memory busses. In the depicted embodiment, the first and second host chips 80, 82 are Micron Samurai™ chips available from Micron Electronics, Inc. of Boise, Id. The first chip 80 bridges the first and second processors 70A, 70B to memory and to a PCI1 bus; while the second chip 82 bridges the first and second processors 70A, 70B with an accelerated PCI2 bus. However, the first and second host chips 80, 82 may be any host chips that are suitable for operation with first and second processors 70A, 70B. For example, such host chips could include but are not limited to host chips from Intel Orion 82450™ and Intel Orion 82454™ family chip sets, available from Intel Corporation of Santa Clara, Calif.

In one embodiment, first and second processors 70A, 70B, respectively, include gunning transistor logic ("GTL") bus terminations for the data section 72A, 72B and address/control section 74A, 74B contacts. Accordingly, the host bus 90/92 is designed to terminate at the first and second processors. For this reason, first and second host chips 80, 82, respectively, ordinarily are physically located between the first and second processors 70A, 70B to minimize the required length of the host bus.

The actual data bus 92 and address/control bus 90 each comprise a plurality of physical traces corresponding to the individual signal lines of the bus. These traces are embedded into various layers of the system board (e.g., motherboard), which is not shown. The darkened lines 192 and hashed lines 190 generally identify the routing patterns of the physical data and address/control busses 92, 90, respectively. Among other things, the depicted bus patterns show the relative lengths of data bus 92 and address/control bus 90. Moreover, the routings indicate the number of times the data bus 92 and address/control bus 90 are required to cross one another. It is important for a board designer to minimize both of these variables in order to reduce trace lengths, as well as the number of layers required to implement a system board.

Figure 1A:
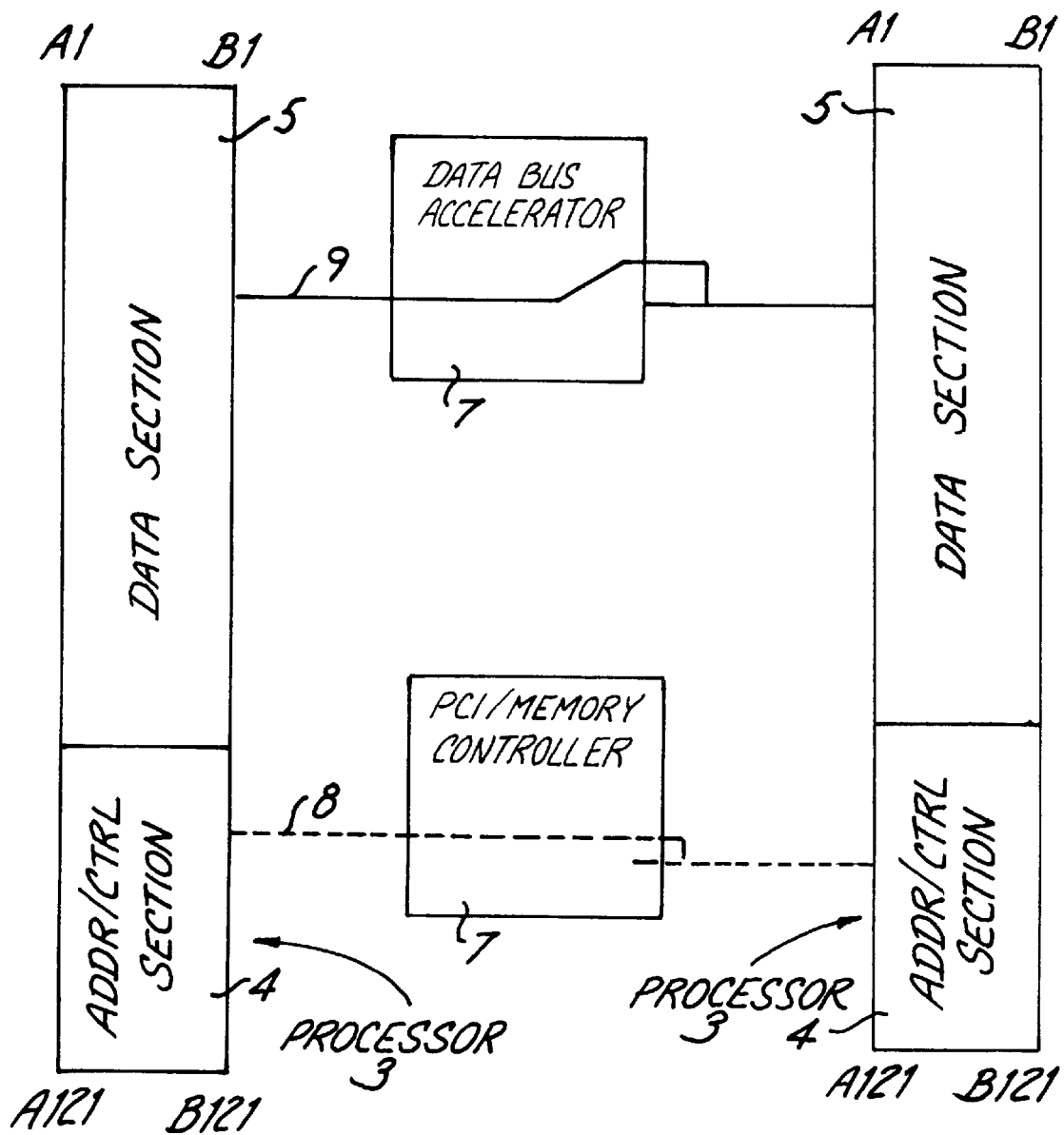
FIG. 1A is a bus path diagram for a dual-processor arrangement of the prior art for a first type of chip set.
Figure 1B:
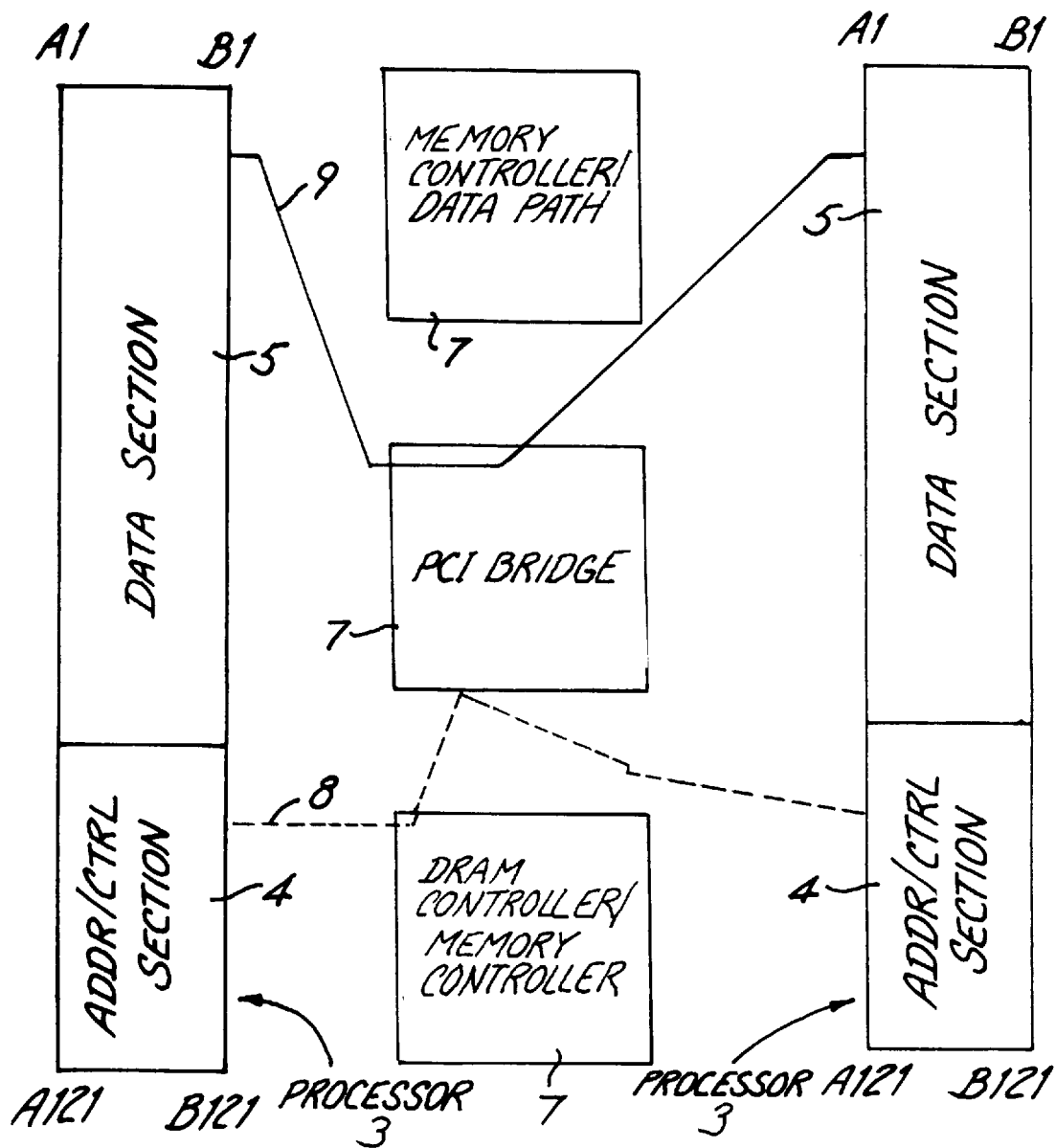
FIG. 1B is a bus path diagram for a dual-processor arrangement of the prior art for a second type of chip set.
Figure 1C:
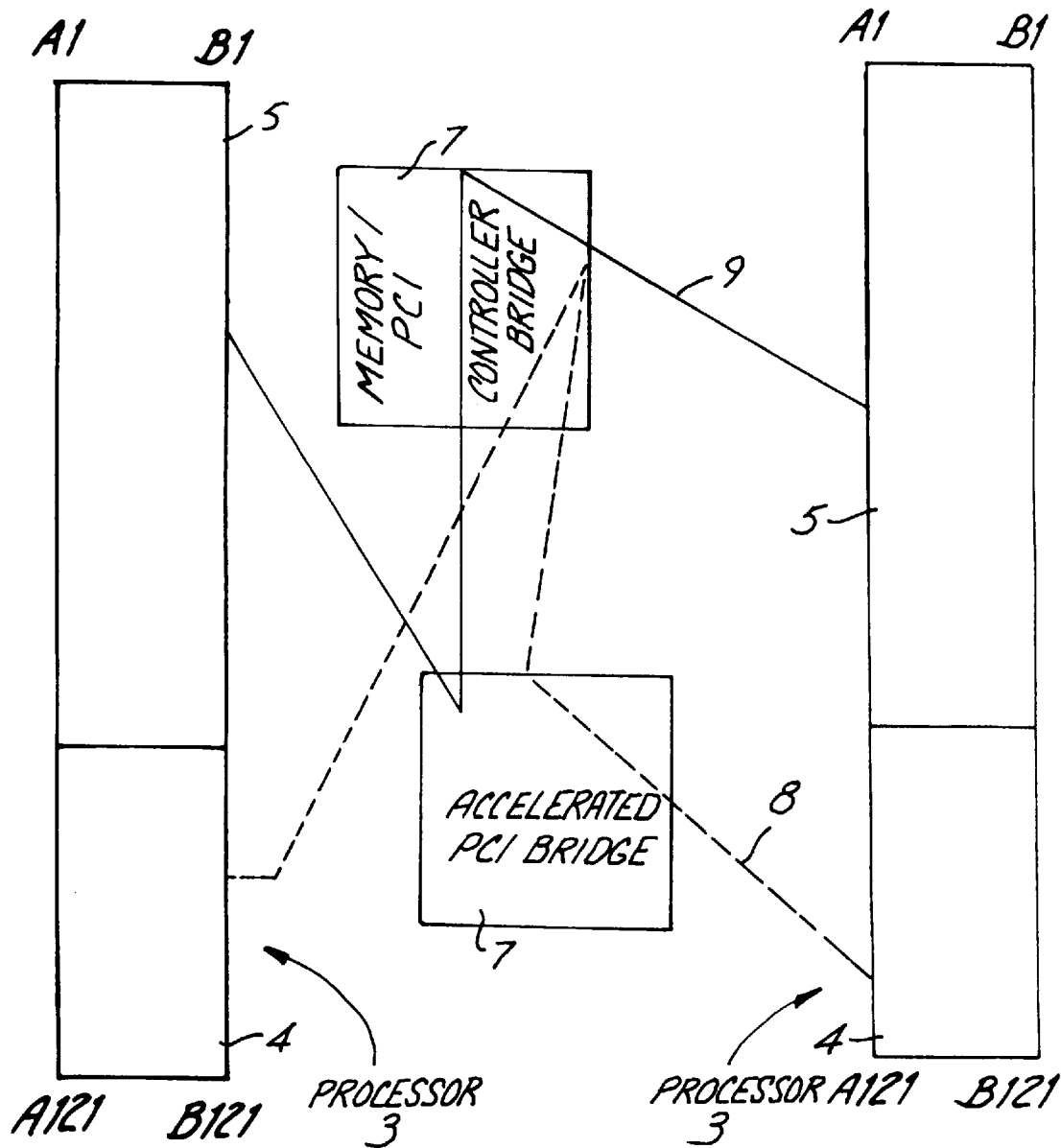
FIG. 1C is a bus path diagram for a dual-processor arrangement of the prior art for a third type of chip set.

As can be seen in FIG. 2A, (as contrasted with the conventionally-oriented prior art from FIG. 1C), reversing the orientation of the processors allows the bus lengths and bus crossovers to be reduced. Just as with two points, the shortest distance between two processors is a straight line (or at least the straightest line that is feasible). Reversing the orientation of the processors enables the data bus 92 and address/control bus 90 to connect the processors and host chips with a single, quasi-diagonal trace sweep, that is not required to backtrack in order to connect first and second processors 70A, 70B to each of the host chips 80 and 82. Not only does this reduce the necessary lengths of the bus traces, but also, it limits the number of required crossovers to one, which can minimize the number of required system board layers.

5.1.2 Alternative Embodiment

Figure 2B:
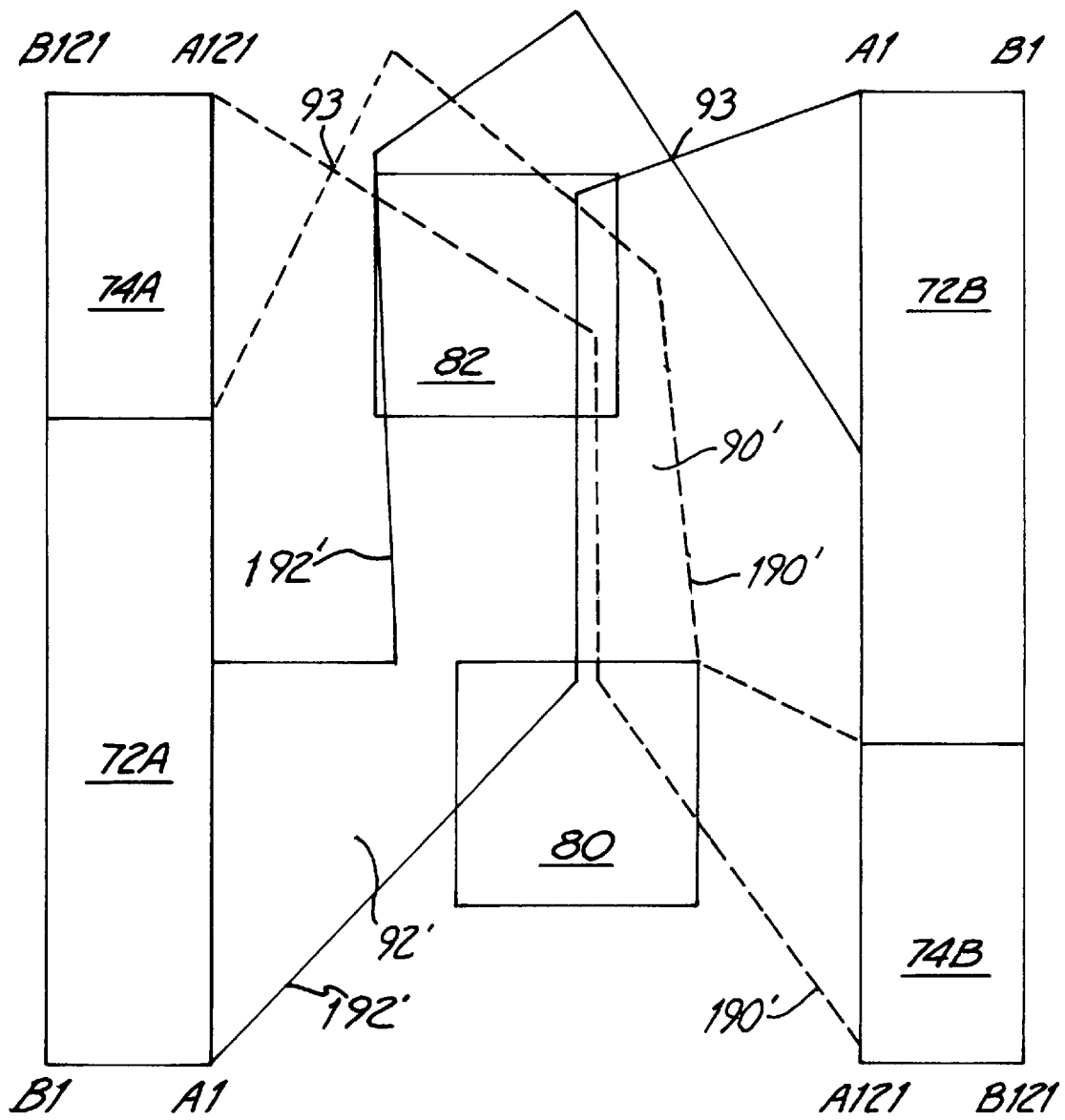
FIG. 2B is a bus routing diagram depicting another embodiment of a bus routing for processors arranged in reverse orientation in accordance with the present invention.

FIG. 2B shows an alternative embodiment for routing the host bus in the dual-processor system. of FIG. 2A. Dashed lines 190' identify a routing pattern for the traces that constitute address/control bus 90'. Likewise, darkened lines 192' identify a routing pattern for the traces that constitute data bus 92'. It can be seen with this embodiment that the bus trace lengths are reduced. The traces are more concentrated to consume less system board space, which enables each bus to connect with its corresponding contact grid sections exclusively on the side of the contact grid section that is proximate to a host chip 80, 82. Unfortunately, space on a second system board layer may be needed to accommodate bus traces where the routing patterns are too narrow, e.g., at 93. However, a second board layer may be an acceptable compromise in return for reduced bus lengths especially where space exists on a second layer that is already being used for the crossover between the data bus 90' and address/control bus 90'.

5.2 Reverse-Oriented Dual-Processor Assembly

Figure 4:
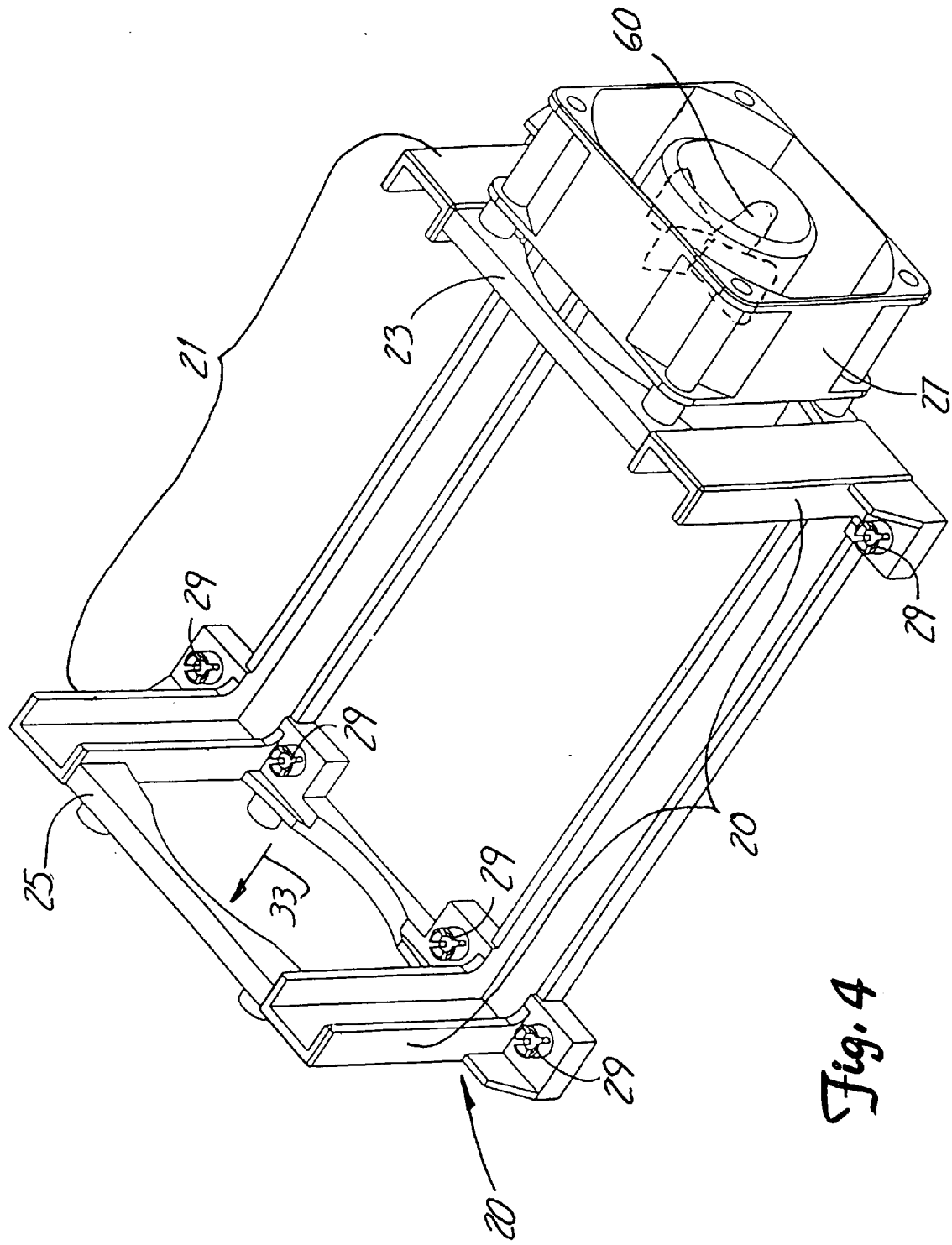
FIG. 4 is a top perspective view of a mounting chassis for mounting processors in reverse orientation.
Figure 5:
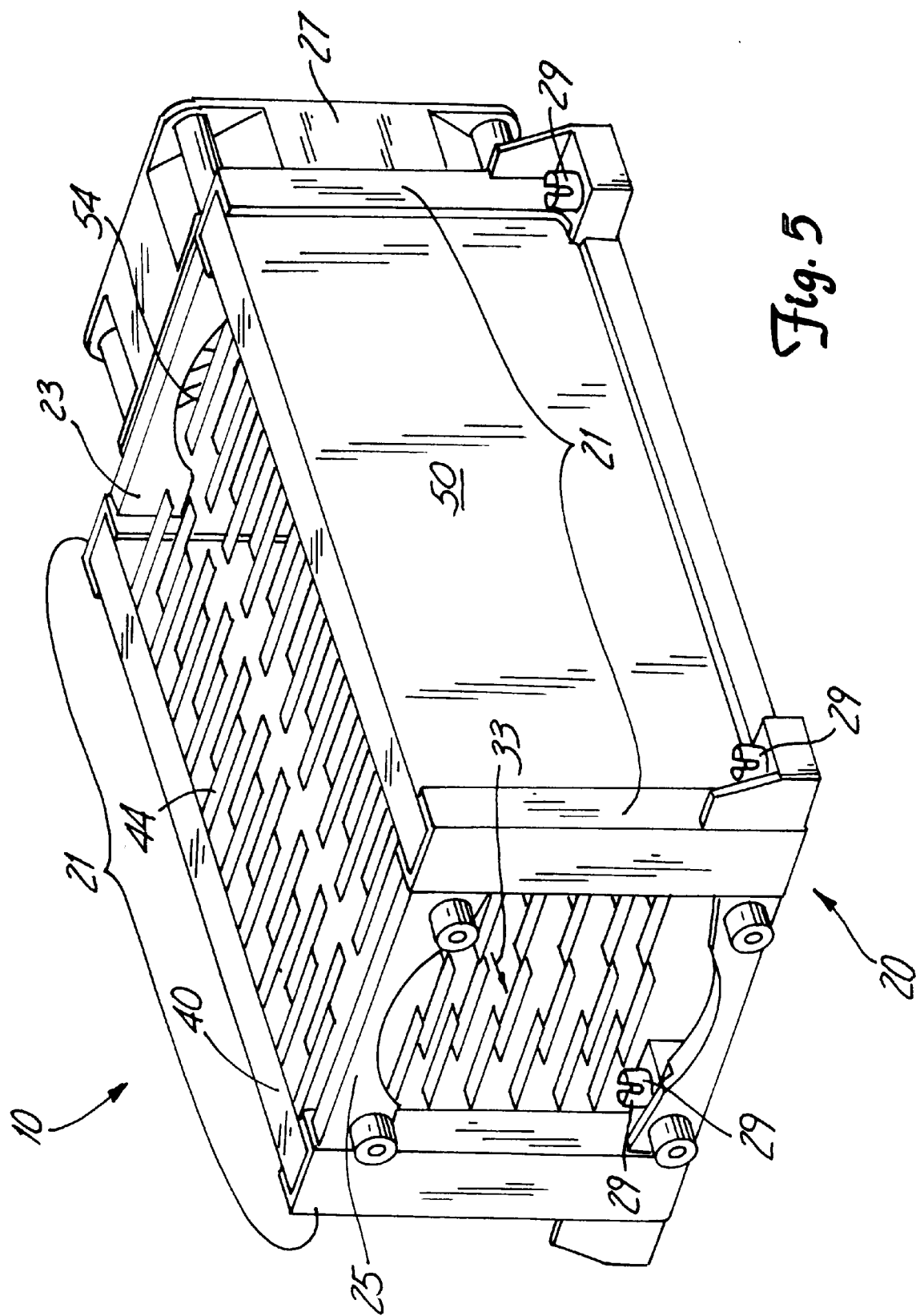
FIG. 5 is a perspective view of a second embodiment of a reverse-oriented dual-processor assembly depicting a separate heatsink for each processor module.

FIGS. 3, 4, and 5 depict a first embodiment of a reverse-oriented dual-processor assembly 10 for implementing a reverse-oriented, dual-processor system. A mounting chassis 20 holds a first vertically-mountable processor module 40 in reverse-orientation relative to a second vertically-mountable processor module 50. The chassis 20 is mounted to a system board (not shown) with mounting screws 29. (The vertically-mountable processor modules 40, 50 are removably and operably connected to a system board host bus through connectors, not shown, which are mounted to the system board.) Also included is a fluid propeller 60 (e.g., a fan) for propelling a heat conveying fluid through the channel 70, which is formed between first-processor and second-processor heat dissipation surfaces 42 and 52 of the first and second vertically-mountable processor modules 40, 50, respectively.

A vertically-mountable processor module may be any processor module or card having a significant portion of its heat-dissipation surface(s) in a non parallel (e.g., perpendicular, sloped inward, sloped outward) relation to the system board to which the module is connected. A vertically-mountable processor module includes but is not limited to (1) a processor (e.g., a Pentium II™) packaged in a single edge cartridge or (2) a processor (e.g., a Pentium Pro™, AMD K6™, Cyrix 6X86TM) mounted within a SEC package or onto a circuit card that is connected to the system board.

A heat-dissipation surface is a surface of the vertically-mountable processor module that is used for dissipating heat away from the processor when it is in operation. Normally, a heat-dissipation surface is designed to accommodate or connect to a heatsink for increasing the rate at which heat is transferred away from the module. Typically, when vertically-mountable processor modules are in reverse-orientation, their heat-dissipation surfaces substantially face one another, as with heat-dissipation surfaces 42, 52 of the first and second vertically-mountable processor modules of FIG. 3. (Heat-dissipation surfaces "substantially face one another" when at least portions of the surfaces are across from one another. Moreover, the surfaces need not be parallel with respect to one another; they may slope inward or away from one another, thereby creating a somewhat triangular cross-section.)

With reference to FIG. 4, the mounting chassis 20 includes retention frames 21 for supporting the first and second vertically-mountable processor modules 40, 50 in reverse orientation. In one embodiment, retention frames 21 are "slot-based." A slot-based retention frame slidably receives and supports a slot-based, vertically-mountable processor module, e.g., an Intel Pentium II™ processor connected to a slot-1 connector.

Retention frames 21 are connected together and spaced apart with an input separation bracket 23 and an output separation bracket 25. Input separation bracket 23 includes input orifice 31, which conveys fluid from fluid propeller 60 into the channel 70. In turn, output separation bracket 23 includes output orifice 33, which conveys the fluid out of the channel 70.

The mounting chassis also includes fluid propeller housing 27. In the depicted embodiments, the fluid propeller housing 27 is removably secured to the input separation bracket 23. The fluid propeller housing 27 receives and secures the fluid propeller 60 such that the fluid is directed into the input orifice 31 and through the channel 70. (However, skilled artisans will recognize that this housing could also be mounted to the output separation bracket 25, with the fluid propeller 60 drawing fluid from the channel 70 rather than propelling fluid into it.)

The fluid propeller 60 may be any device that is capable of propelling the fluid through channel 70. The fluid propeller 60 includes but is not limited to a fan, a compressor, a turbine, or an output from a fluid-propelling hose. The fluid may be any fluid that can adequately convey heat away from the first and second heat-dissipation surfaces 42, 52 and that may be propelled by the fluid propeller 60. Such fluids, which may be gasses or liquids, would optimally be thermally but not electrically conductive.

For improved heat dissipation, heatsinks 44 and 54 may be mounted to heat-dissipation surfaces 42 and 52, respectively (as shown in FIG. 5). Alternatively, a unitary heatsink 64 (as shown in FIG. 6) may be implemented to increase the conductive surface area within the channel 70. Heat-dissipation surfaces 42 and 52 would then be mounted to opposite sides of heatsink 64.

In operation, vertically-mountable processor modules 40, 50 generate considerable amounts of heat, which are dissipated through heat-dissipation surfaces 42 and 52. Heatsinks 44, 54 (or alternatively unitary heatsink 64) enhance this heat dissipation by "drawing" heat away from the heat-dissipation surfaces 42, 52 and distributing it within the channel 70. In turn, fluid is propelled by the fluid propeller 60 through the channel 70 (and across the conductive surfaces of the heatsinks) to convey this heat out of the channel 70. The fluid improves the ability of the heatsinks to transfer heat away from heat-dissipation surfaces 42, 52 and thus, away from the vertically-mountable processor modules 70A, 70B.

5.3 Other Embodiments

It will be seen by those skilled in the art that various changes may be made without departing from the spirit and scope of the invention. For example, some multi-processor computers operate with one, as well as with multiple, processors. Their system boards are designed and constructed to accommodate more than one processor, but the computer, for example, may initially be assembled and operated with a single processor. Thus, the board can be so designed to incorporate an embodiment of the present invention, e.g., it may include processor connectors that are arranged with the host bus to operably receive processors in reverse-orientation.

In addition, reversing the orientation of vertically-mountable processor modules will improve heat transfer efficiency for a first and second processor regardless of their particular contact grid layouts. Moreover, separation brackets 23, 25 could be made adjustable so that the distance between the first and second processor modules 40, 50 could be varied. In this manner, one mounting chassis would be suitable for a variety of system board designs.

Accordingly, the invention is not limited to what is shown in the drawings and described in the specification but only as indicated in the appended claims.

6. Remarks

Reversing the orientation of processors in a dual-processor configuration improves the design of a computer system in several ways. Bus trace lengths can be reduced, which not only increases available system board space but also improves computer operability by reducing signal reflections. In addition, with reverse orientation, the number of required data and address/control bus intersections may be reduced to one.

Moreover, the heat dissipation surfaces of the processor modules can face one another, which increases heat transfer efficiency for conveying heat away from the processors. With the use of a common fluid channel, the overall cross-section of the fluid stream for cooling both processors may be reduced. In turn, the size and, in some applications, the number of required fluid propeller(s) for generating this fluid stream may also be reduced.

Other advantages of the present invention will become more fully apparent and understood with reference to the appended drawings and claims.

What is claimed is:

1. A multi-processor system comprising:
    (a) a system board having a host bus that includes a data bus and an address/control bus;
    (b) a first processor having a first processor data contact section and a first processor address/control contact section, wherein the first processor data contact section is electrically connected to the data bus and the first processor address/control contact section is electrically connected to the address/control bus;
    (c) a second processor in reverse orientation with the first processor, the second processor having a second processor data contact section and a second processor address/control contact section, wherein the second processor data contact section is electrically connected to the data bus and the second processor address/control contact section is electrically connected to the address/control bus; and
    (d) a host chip mounted to the system board, said host chip having a plurality of data contacts electrically connected to the data bus and a plurality of address/control contacts electrically connected to the address/control bus, where the data bus and address/control busses need only intersect each other once.

2. The system of claim 1 further comprising a second host chip mounted to the system board.

3. The system of claim 2, wherein the first and second host chips are located between the first and second processors.

4. The system of claim 1, wherein the first processor is packaged in a single edge cartridge.

5. The system of claim 4, wherein the first processor includes a first processor heat-dissipation surface and the second processor includes a second processor heat dissipation surface thereby forming a fluid channel for dissipating heat away from the first and second processors.

6. The system of claim 5, wherein the first processor heat dissipation surface substantially faces the second processor heat dissipation surface.

7. The system of claim 6 further comprising a fluid propeller aligned to propel fluid through the channel to dissipate heat away from the first and second processors.

8. The system of claim 7 further comprising a mounting chassis having a first retention frame for removably securing the first processor, a second retention frame for removably securing the second processor, and a fluid propeller housing for securing the fluid propeller, wherein the mounting chassis is mounted to the system board.

9. A reverse-oriented dual-processor assembly to be mounted onto a system board, the assembly comprising:
    (a) a first vertically-mountable processor module having a first-processor heat-dissipation surface, the first vertically-mountable processor module to be mounted to the system board;
    (b) a second vertically-mountable processor module having second-processor heat-dissipation surface, the second vertically-mountable processor module to be mounted to the system board, the first and second vertically-mountable processor modules being aligned such that the first-processor and second-processor heat-dissipation surfaces form a channel when the first and second vertically-mountable processor modules are mounted to the system board; and
    (c) a fluid propeller aligned to propel a fluid through the channel to convey heat out of the channel and thereby away from the first-processor and second-processor heat-dissipation surfaces.

10. The assembly of claim 9, wherein the first-processor and second-processor heat-dissipation surfaces face one another when the first and second vertically-mountable processor modules are mounted to the system board.

11. The assembly of claim 9, further comprising:
    (i) a first host chip; and
    (ii) a host bus having a data bus and an address/control bus, wherein the data bus and address/control bus electrically connect the first vertically-mountable processor module, the first host chip, and the second vertically-mountable processor module to one another when mounted to the system board.

12. The assembly of claim 11 further comprising a second host chip that is electrically connected to the data and address/control busses when mounted to the system board.

13. The assembly of claim 12, wherein the host bus terminates at the first and second vertically-mountable processor modules when mounted to the system board.

14. The assembly of claim 12, wherein the host bus terminates on the system board.

15. The assembly of claim 11 further comprising a first heatsink mounted in heat transfer relation with the first-processor heat-dissipation surface, the heatsink extending away from the first vertically-mountable processor module and into the channel to convey heat away from the first vertically-mountable processor module.

16. The assembly of claim 15, wherein the second-processor heat-dissipation surface is mounted in heat transfer relation with the first heatsink.

17. The assembly of claim 15 further comprising a second heatsink mounted in heat transfer relation to the second-processor heat-dissipation surface.

18. The assembly of claim 9 further comprising a mounting chassis to be mounted to the system board, wherein the mounting chassis includes a first retention frame to receive the first vertically-mountable processor module, a second retention frame spaced apart from the first retention frame to receive the second vertically-mountable processor module, and a fluid propeller housing to mount the fluid propeller for propelling the fluid through the channel.

19. The assembly of claim 18, wherein the fluid propeller is an electrical fan.

20. The assembly of claim 19, wherein the fluid is air.

21. The assembly of claim 20, wherein the first and second retention frames are slot-based retention frames.

22. The assembly of claim 21, wherein the first retention frame is a slot 1 retention frame.

23. The assembly of claim 9, wherein the first vertically-mountable processor module is a processor that is packaged in a single edge cartridge.

24. A system board for accommodating a reverse-oriented dual-processor assembly, the system board comprising:

(a) a first connector for receiving a first vertically-mountable processor module having a first-processor heat-dissipation surface, the first connector being electrically mounted to the system board; and (b) a second connector for receiving a second vertically-mountable processor module having a second-processor heat-dissipation surface, the second connector being aligned and electrically mounted to the system board such that the first-processor and second-processor heat-dissipation surfaces form a channel when the vertically-mountable processor modules are inserted into the first and second connectors.

25. The system board of claim 24 further comprising a fluid propeller aligned to propel a fluid through the channel to convey heat out of the channel and thereby away from the first and second vertically-mountable processor modules.

26. The system board of claim 25, wherein the first-processor and second-processor heat-dissipation surfaces substantially face one another when the first and second vertically mountable processor modules are operably inserted into the first and second connectors.

27. The system board of claim 24 further comprising:

(i) a host bus having an address/controls bus and a data bus that are each operably connected to the first and second connectors; and (ii) a host chip operably connected to the data and address/control busses.

28. The system board of claim 27 further comprising a second host chip operably connected to the data and address/control busses.

29. The system board of claim 27, wherein the host bus terminates at the first and second connectors when the first and second vertically-mountable processor modules are inserted therein.

30. The system board of claim 27 further comprising a first heatsink mounted with the first-processor heat-dissipation surface to convey heat away from the first vertically-mountable processor module.

31. The system board of claim 30, wherein the first heatsink is mounted with second-processor heat-dissipation surface.

32. The system board of claim 30 further comprising a second heatsink mounted with the second-processor heat-dissipation surface to convey heat away from the second vertically-mountable processor module.

33. The system board of claim 24 further comprising a mounting chassis mounted to the system board, wherein the mounting chassis includes a first retention frame to receive the first vertically-mountable processor module and a second retention frame spaced apart from the first retention frame to receive the second vertically-mountable processor module.

34. The system board of claim 33 including a housing to mount a fluid propeller aligned to propel fluid through the channel.

35. The system board of claim 34, wherein the fluid propeller is an electrical fan.

36. The system board of claim 34, wherein the fluid is air.

37. The system board of claim 36, wherein the first and second retention frames are slot-based retention frames.

38. The system board of claim 36, wherein the first retention frame is a slot 1 retention frame.

39. The system board of claim 24, wherein the first and second vertically-mountable processor modules are processors packaged in a single edge cartridge.

40. A computer with an improved dual-processor arrangement, the computer comprising:

(a) a first vertically-mountable processor module connected to a system board, the first vertically-mountable processor module including a first-processor heat-dissipation surface;

(b) a second vertically-mountable processor module connected to the system board in reverse orientation with the first vertically-mountable processor module, the second vertically-mountable processor module having a second-processor heat-dissipation surface, wherein the first-processor and second-processor heat-dissipation surfaces define a channel; and (c) a fluid propeller for propelling fluid through the channel to convey heat away from the first-processor and second-processor heat dissipation surfaces.

41. The computer of claim 40, wherein the first and second vertically-mountable processor modules each include a data contact section and an address/control contact section, the computer further comprising:

(i) a host bus that includes a data and an address/control bus, and (ii) a host chip mounted to the system board and operably connected to the data and address/control busses, whereby the host chip and the data sections of the first and second vertically-mountable processor modules are connected to the data bus, and the first host chip and the address/control sections of the first and second vertically-mountable processor modules are connected to the host address/control bus.

42. The computer of claim 41, wherein the host chip is substantially between the first and second vertically-mountable processor modules.

43. The computer of claim 42 further comprising a second host chip operably connected to both the data and address/control busses, wherein the second host chip is substantially between the first and second vertically-mountable processor modules.

* * * * *